Aug. 10, 1965 J. K. CRAWFORD ETAL 3,200,242

BYTE-CONVERTER ERROR-CHECK CIRCUIT

Filed March 31, 1961 2 Sheets-Sheet 1

INVENTORS
JOHN K. CRAWFORD
CHESTER M. PIETRAS

BY Bernard M. Goldman
ATTORNEY

6-TO-8 CONVERSION

8-TO-6 CONVERSION

United States Patent Office 3,200,242
Patented Aug. 10, 1965

3,200,242

BYTE-CONVERTER ERROR-CHECK CIRCUIT

John K. Crawford and Chester M. Pietras, Poughkeepsie, N.Y., assignors to International Business Machines Corporation, New York, N.Y., a corporation of New York Filed Mar. 31, 1961, Ser. No. 99,927
12 Claims. (Cl. 235—153)

Figure 1:
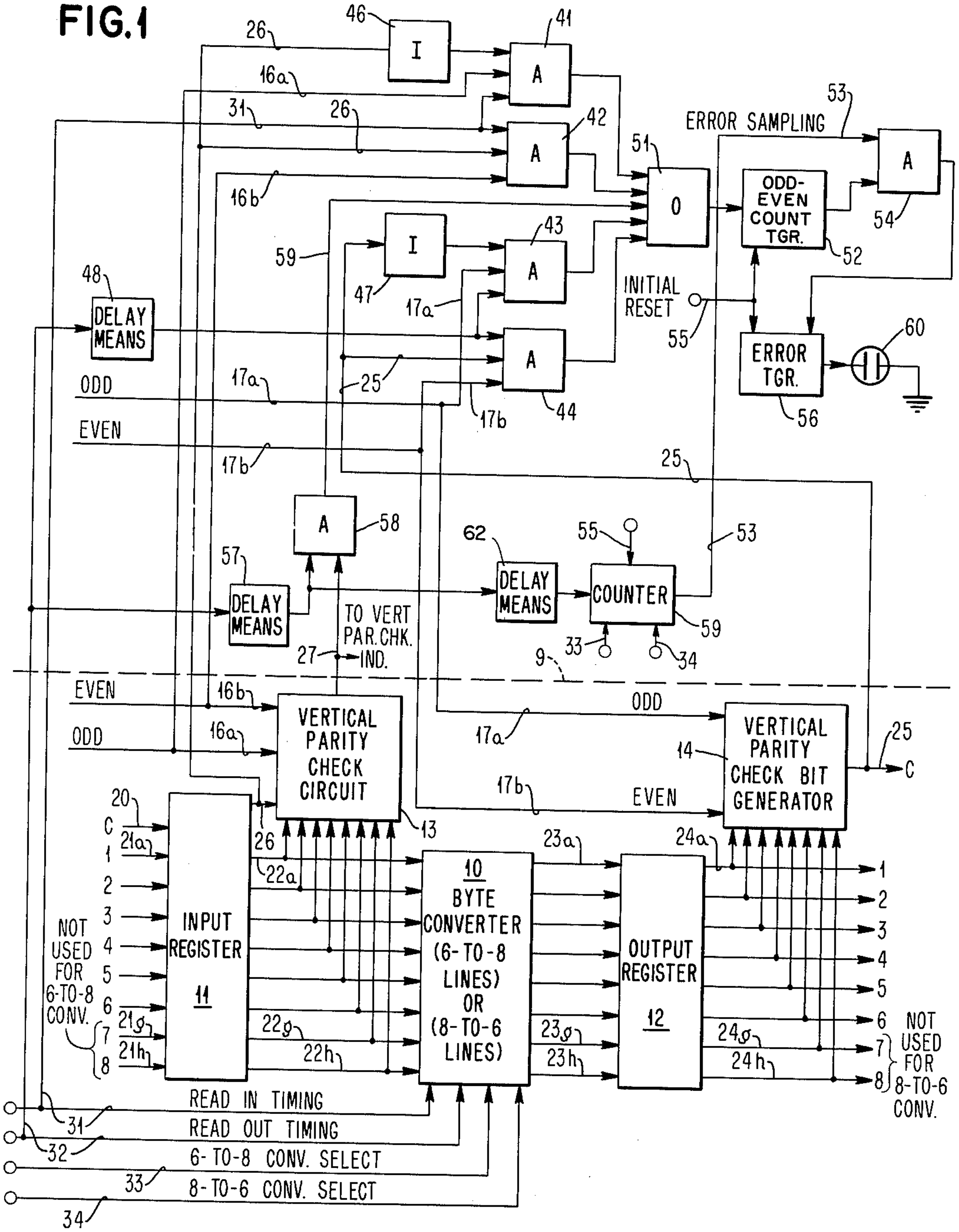

This invention relates to means for error checking the operation of a byte-converter circuit.

Prior byte converter and error check circuits are described and claimed in the U.S. patent application, Serial No. 784,669, filed January 2, 1959, and now Patent No. 3,079,597, by Herbert K. Wild and assigned to the same assigned as the present application.

Briefly, a "byte" is a plurality of parallel binary data bits. For example, a byte of N bits may be simultaneously provided on N number of transmission lines.

A "byte converter" is a circuit for modifying the serial-parallel arrangement of data bits being transmitted. It is more complicated than a mere series to parallel conversion in that there are plural bits both before and after the byte conversion, since by definition a byte is a plurality of parallel bits. In effect, a "byte converter" is a circuit for changing the number of transmission lines used to transmit data bits from a first number $N_1$ to a second number $N_2$. Also $N_1$ is the number of bits in an input byte, and $N_2$ is the number of bits in an output byte. No code conversion is involved in a byte conversion, which merely redistributes received bits among a greater and lesser number of transmission lines. The time between bytes is changed by the conversion, and is increased when the number of bits in an output byte is increased, or vice versa. In this specification, neither $N_1$ nor $N_2$ need be an integer multiple of the other.

A "byte conversion cycle" involves several converter input and output bytes. The total number of data bits in a byte conversion cycle is a number, $N_3$, in which $N_1$ and $N_2$ are submultiples of $N_3$. $N_3/N_1$ is the number of input bytes per cycle, and $N_3/N_2$ is the number of output bytes per cycle. Thus during any single cycle of operation, identical binary bits are provided at both the input and the output of a byte converter. The duration of a byte conversion cycle is from the start of the first input byte to the end of the last output byte within the single cycle.

A parity check bit received with any input byte has no relationship to a parity check bit provided with any output byte. This is due to the redistribution of data bits between input and output bytes of a byte converter. Accordingly, no attempt is made to carry input check bits through the byte converter; and input check bits are dropped after they are used to make a vertical redundancy check of received input bytes.

However, a check-bit generator is provided at the output of the byte converter to generate check bits for output bytes. One of its purposes is to provide a parity check for output bytes after they have been transmitted to another place to determine errors in transmission.

This invention utilizes relationships between check bits of input bytes and check bits of output bytes over each converter cycle. The relationship varies according to whether even or odd parity is used for input or output bytes. If even-parity "1" check bits are used for both input and output bytes, the invention can use a single bistable circuit to sum the "1" check bits over a cycle, as long as means is also provided to assure a time-separation between bits provided to the simple counting circuit. Only a single bistable circuit is required because the only information needed about the summation is whether it is odd or even.

If odd-parity "1" check bits are provided at either the converter input or output, or both, the "1" bits cannot be directly summed as in the case of even-parity operation. With the case of odd parity, an ambiguity occurs in the summation over a cycle; wherein it is possible for an error to occur in the conversion circuit without an error indication by the check circuit. The invention avoids this ambiguity by inverting odd-parity check bits prior to applying them to the summation circuit so that only the "0" check bits are summed. When this is done, the check circuit can flawlessly indicate any single error occurring over a converter cycle without regard to any combination of even or odd parity used at the input or output of the byte converter circuit. After each converter cycle, and before the next converter cycle, the summation circuit is sampled. It should then have an even count if there is no error in converter operation. An odd count indicates an error in the converter operation.

However, the invention has sitill another feature which avoids ambiguity when an error exists in an input byte. This error will of course be indicated by an input-byte vertical-parity check circuit. But also in this case, a conversion check circuit could indicate an error in the converter, since the bit error is carried through the byte converter, even though no error has occurred in the operation of the byte converter. To avoid this circumstance, the invention uses an error indicating output from an input-byte vertical-parity check circuit to add an extra count to the summation circuit, so that no error is indicated in the conversion circuit, where no operation error occurred. If an error does occur in both the input byte and the operation of the conversion circuit, both check circuits give true error indications.

Objects of this invention are therefore to provide a byte-conversion check circuit:

(1) That is operable unambiguously with odd-redundancy check bits, as well as even-redundancy check bits, provided at both the input and output of the byte converter.

(2) That is operable with odd-redundancy check bits at its input ond even-redundancy bits at its output, or vice versa.

(3) That can avoid a converter operation errer indication when in fact the only error exists in an input byte.

(4) That can accommodate any size input and output bytes, and changes in numbers of bits in said bytes without affecting the operation of this invention.

(5) That is operable with odd-redundancy check bits at either or both the input or output of a converter when the input bytes are discontinued before completing an entire cycle. This permits records to be handled which are not divisible by $N_3$.

The foregoing and other objects, features and advantages of the invention will be apparent from the following more particular description of a preferred embodiment of the invention, as illustrated in the accompanying drawing, in which:

FIGURE 1 represents an embodiment of the invention; and FIGURES 2A–F, and 3A–F provide waveforms used in explaining the invention.

A dashed line 9 is noted in FIGURE 1. The circuitry above dashed line 9 illustrates features added by this invention in combination with the previously-existing features illustrated below dashed line 9.

Below line 9 there is shown a byte converter circuit 10. Converter circuit 10 has input lines 22*a*–*h* provided from an input register 11, which receives corresponding inputs on lines 21*a*–*h*. Also register 11 receives a check bit on a line 20 for each input byte. Register 11 is conventional and may comprise nine parallel bistable circuits for storing the input bits for up to one input bit period.

In a like manner, converter 10 has output leads 23*a–h* which are provided to a conventional output register 12. Register 12 may comprise eight bistable circuits and is basically similar to input register 11 to provide temporary storage of output bits for up to one bit period.

Converter 10 can operate to change six-bit input bytes to eight-bit output bytes; or on the other hand, circuit 10 can change eight-bit input bytes to six-bit output bytes. Lines 33 and 34 select in which mode circuit 10 will operate. Converter 10 can comprise a single converter circuit capable of operation in either a 6-to-8 or 8-to-6 mode as selected by energizing a line 33 or 34. However, circuit 10 can be two conversion circuits (one providing 6-to-8 and the other 8-to-6) having common input and output lines 22*a–h* and 23*a–h*. This type of byte converter is described in the above cited U.S. patent application Serial No. 784,669.

When converter 10 is operating in a 6-to-8 mode, input lines 21*g* and *h*, 22*g* and *h* are not used; but all of its output lines 23*a–h* and 24*a–h* are used. On the other hand, when converter 10 is used in its 8-to-6 mode, all input lines 21*a–h*, 22*a–h* are used, but its output lines 23*g* and *h*, 24*g* and *h* are not used.

Figure 2:
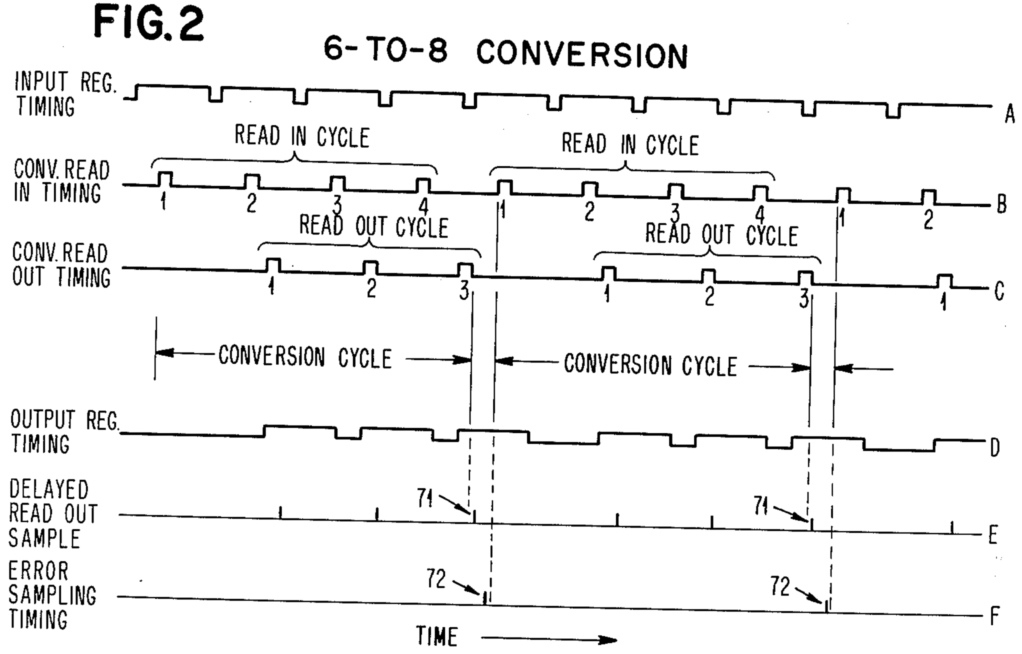

A lead 31 provides the converter loading timing for input bytes, and a lead 32 provides the readout timing for converter output bytes. The type of timing pulses provided on leads 31 and 32 is dependent on whether a 6-to-8 or 8-to-6 conversion mode is selected. FIGURES 2B and C illustrate the timing of pulses on leads 31 and 32, respectively, when converter 10 is operating with a 6-to-8 conversion mode. On the other hand, FIGURES 3B and C illustrate timing pulses on leads 31 and 32, respectively, for an 8-to-6 conversion mode. Thus there is a substantial reversal in the timing relationship for pulses on leads 31 and 32 when the converter mode is changed.

A vertical-parity check circuit 13 has inputs connected respectively to leads 22*a–h*. Also, circuit 13 receives a check bit on a lead 26 with each input byte on leads 22*a–h*, although the last two leads 22*g* and *h* will not be used for six-bit input bytes. Circuit 13 has an output lead 27 which provides a signal if a vertical-parity check error is sensed by circuit 13.

Vertical-parity check circuit 13 is conventional and may operate with even or odd parity check bits. Check circuit 13 can be the same as shown in FIGURE 18 of U.S. Patent 2,939,116. One of input leads 16*a* and *b* is respectively energized by means not apart of this invention to select odd or even parity check operation for circuit 13.

A conventional vertical-parity check-bit generator 14 has inputs connected to output leads 24*a–h*. Generator 14 may be of the type in FIGURE 14 of U.S. Patent No. 2,939,116. Generator 14 provides an output check bit on a lead 25 for each output byte provided on leads 24*a–h*. Of course, the last two leads, 24*g* and *h* are only used for eight bit output bytes. Leads 17*a* and *b* are connected to generator 14 and respectively select whether it will generate odd or even parity check bits. Activation of leads 17*a* or *b* is accomplished by external control (not shown) and not a part of this invention.

The circuitry in FIGURE 1 above dashed line 9 provides an embodiment of a check circuit for indicating errors caused within converter 10. Whenever an error occurs in circuit 10, an error-indicating trigger circuit 56 is set to light a bulb 60. Before circuit operation, trigger 56 is reset to a non-error indicating status by a reset pulse on a lead 55.

A single bistable counting device in FIGURE 1 is a trigger 52 which receives all input and output check bits (or a complement thereof in the case of odd parity). Counting trigger 52 may be any bistable circuit capable of being triggered to an opposite state by each of its input pulses. In effect, it sums only the lowest-order digit of any complete summation, since it drops all carries and higher-order digits. But the lowest-order digit is sufficient to determine the odd or even status of any total of received digits; and the odd or even status of a summation is its only important characteristic for providing a single error check over a cycle of converter operation. Trigger 52 is initially reset by a pulse on lead 55 to provide an output "0" that represents an even status.

After each cycle of operation by converter 10, the summed output of trigger 52 is sampled by an AND circuit 54, using an error sampling timing pulse provided on a lead 53. If a conversion error exists, AND gate 54 will be primed by an "odd" output "1" from trigger 52. Thus when sampled, an output results which sets trigger 56, if the summation by trigger 52 is an odd count. Then, trigger 56 provides an output which lights bulb 60 to indicate that an error has occurred during the preceding cycle of converter operation.

Means is provided by this invention to assure that the check-bit actuations of trigger 52 do not coincide. Thus, a plurality of AND circuits 41 through 44 controls the time selection of check bits (or their complement) for actuating count trigger 52. An OR circuit 51 couples the outputs of AND gates 41–44 to the input of trigger 52.

Gates 41 and 42 operate with converter input check bits, and gates 43 and 44 operate with converter output check bits.

AND gate 42 receives input check bits provided on line 26; AND gate 41 receives inverted input check bits from an inverter 46, which receives the input check bits from line 26. For input odd parity, gate 41 is selected by energization of line 16*a*; and for input even parity, gate 42 is selected by energization of line 16*b*.

In a like manner AND gates 43 and 44 operate with inverted and non-inverted outputs from check-bit generator 14. An output line 25 from generator 14 connects to an input of gate 44, and through an inverter 47 to an input of gate 43. One of the gates 43 or 44 is selected according to whether odd or even parity is chosen for the operation of check-bit generator 14 by bringing up one of lines 17*a* or *b*.

Thus, lines 16*a* or *b* and 17*a* or *b* are selected by external means (not shown) according to the input-output vertical parity combination used. Line 16*a* is brought-up for input-odd parity, or line 16*b* is brought up for input-even parity. Line 17*a* is brought up for output-odd parity, or line 17*b* is brought up for output-even parity.

The check bits on lines 25 and 26 have the timing of the output and input register, respectively; and they would interfere with each other if directly applied to count trigger 52. However, the sampling prevents the input check bits (or their complement) from interfering with output check bits (or their complement). This assures sequential triggering of trigger 52 without ambiguous coincident triggering.

Figure 3:
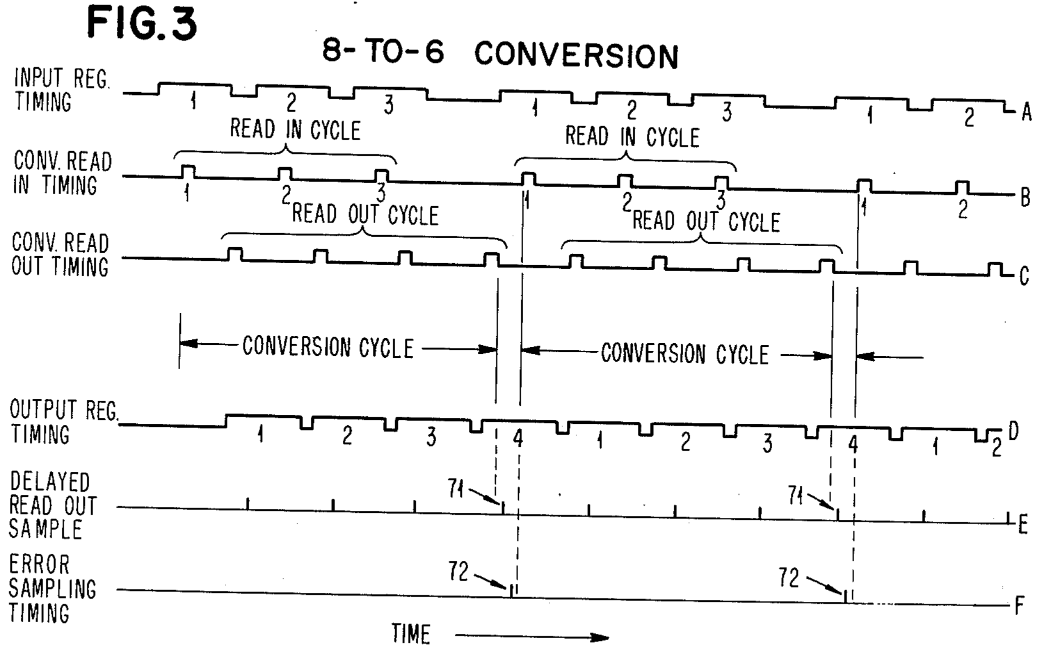

The read-in and read-out timing for converter 10 is illustrated in FIGURES 2B and C for the 6-to-8 conversion mode, and in FIGURES 3B and C for the 8-to-6 conversion mode of operation of converter 10. The converter read-in and read-out timing is used for sampling input and output check bits provided on leads 26 and 25 to avoid interference due to register output timing. The time availability of input bytes with input check bits from register 11 is illustrated by the input-register timing in FIGURES 2A and 3A. Thus an input check bit may be available from register 11 during both a read-in and read-out pulse. The sampling timing for gates 41–44 avoids this interference. Likewise, outputs from output register 12 shown in FIGURES 2D and 3D could cause interference, which is avoided by the sampling timing.

The sampling timing for gates 41 and 42 respectively is therefore provided by read-in timing lead 31.

However, sampling timing for gates 43 and 44 is provided from read-out timing lead 32 through a delay means 48. Delay means 48 is needed because the output from generator 14 occurs somewhat later than pulses on read-out timing line 32, since each read-out pulse starts the operation resulting in an output check bit from generator 14. That is, after any read-out pulse time is needed for the operations of converter 10, output registers 12, and generator 14 before an output check bit can be generated. Nevertheless, the sampling pulse to gates 43 and 44 must occur after the generation of a check bit. Hence, the delay by delay means 48 must exceed the operating time for items 10, 12 and 14, but cannot exceed an amount which would interfere with error-sampling pulses to gate 54, which will be discussed later. Delay means 48 may be any type of delay device, such as a delay line, a delay trigger, or an output from a clock ring circuit.

Another feature in FIGURE 1 prevents a false indication by error trigger 56 when an error occurs in an input byte and not by failure of converter 10. Trigger 56 should only indicate errors due to the fault of converter 10. This feature involves applying an error-indicating output from vertical-parity check circuit 13 to the input of count trigger 52 to add one more count to its output. The added count to trigger 52 causes its output to be even, which indicate no error in converter operation. Of course, the error output from vertical-parity check circuit 13 is provided to a vertical-parity check indicator (not shown and not part of this invention) which will indicate when an error occurs with an input byte.

From the viewpoint of byte converter 10, it is desired to have all of its largest bytes time-spaced as evenly as possible. This requirement causes the last output byte of a conversion cycle to precede as closely as possible the first input byte of the next conversion cycle. Yet it is during the interval between conversion cycles that each error-sampling pulse on lead 53 must be provided, as well as a sampling pulse from delay means 48 which must precede the error-sampling pulse but must follow the last readout-timing pulse of a cycle.

Hence, the time spacing between conversion cycles must permit the occurrence of the last delayed readout-sampling pulse 71 and the following error-sampling pulse 72 (shown in FIGURES 2E and F and 3E and F), in order to avoid the possibility of coinciding triggering pulses to trigger 52 from two sources. To generate the timing for error-sampling pulses 72 and to avoid possible coincidence, a delay means 57 is provided, with a slightly longer delay than delay means 48. Delay means 57 likewise has an input connected to lead 32 to receive the read-out timing to converter 10. The output of delay means 57 is provided as one input to gate 58 to sample the error indicating output of check circuit 13. The output of AND gate 58 is provided through OR gate 51 to the input of count trigger 52. Delay means 57 may be of the same type as delay means 48.

The error sampling pulses to gate 54 may be generated by having a delay means 62 that receives the output of delay means 57 and may be of the same type. The output of delay means 62 drives a counter 59 which operates in either of two modes determined by whether 6-to-8 conversion select line 33 of 8-to-6 conversion select line 34 is selected. With line 33 selected, counter 59 provides every third received pulse on its output line 53 as an error sampling pulse. If line 34 is selected, counter 59 provides every fourth received pulse on line 53. Counter 59 is initially reset by a pulse on lead 55 so that the counter only selects the received pulse occurring between conversion cycles.

Parity examples are given in the following table to illustrate the even-odd arithmetic to explain the overall operation of the invention:

| Data Bit Positions | Conversion Cycle (6-to-8) | | Cycle Check-Bit Odd-Even sum |
|---|---|---|---|
| | Input Bytes 1 2 3 4 | Output Bytes 1 2 3 | |
| 1 | 1 0 1 0 | 1 0 1 | |
| 2 | 0 1 1 1 | 0 0 0 | |
| 3 | 0 0 1 0 | 0 0 0 | |
| 4 | 1 0 0 0 | 1 1 1 | |
| 5 | 1 0 1 1 | 1 1 0 | |
| 6 | 0 1 0 0 | 0 1 0 | |
| 7 | | 0 1 1 | |
| 8 | | 1 0 0 | |
| Parity Combination #1 | Input Odd 0 1 1 1 | Output Odd 1 1 0 | 1 |
| Parity Combination #2 | Input Even 1 0 0 0 | Output Even 0 0 1 | 0 |
| Parity Combination #3 | Input Odd 0 1 1 1 | Output Even 0 0 1 | 0 |
| Parity Combination #4 | Input Even 1 0 0 0 | Output Odd 1 1 0 | 1 |
| Parity Combination #1A | Input Invert-Odd 1 0 0 0 | Output Invert-Odd 0 0 1 | 0 |
| Parity Combination #3A | Input Inverted-Odd 1 0 0 0 | Output Even 0 0 1 | 0 |
| Parity Combination #4A | Input Even 1 0 0 0 | Output Inverted-Odd 0 0 1 | 0 |

In the table a set of four six-bit bytes and three eight-bit bytes is illustrated to represent a single 6-to-8 mode cycle by converter 10.

Four basic parity combinations can be provided with respect to the check bits at the converter input and output. They are odd-odd, even-even, odd-even, and even-odd, which are respectively represented in the table as parity combinations #1, #2, #3, and #4. For the latter two cases, this invention provides a modification to even-inverted-odd, and inverted-odd-even, which are respectively represented in the table as parity combinations #3A and #4A. Each of these six combinations is related to the single example of bits given in the table.

The summation of check bits must be even over the cycle to indicate no error. An odd sum is used to indicate an error. The above table does not have any error in its data bits. Nevertheless it is noted that the sum is odd, an error indicating "1," for the situations of odd-odd, and even-odd. Note that the combination odd-even provides the even sum "0" to indicate no error. This example proves that the combinations of odd-even and even-odd cannot be relied upon for accurate indication. At least, the odd-odd combination is consistently error indicating. Yet when the odd parity is inverted, it is noted from combinations #1A, #3A and #4A in the table that no error occurs.

In this invention only the combinations 2, 1A, 3A and 4A are available so that an even "0" output can always be provided when no error occurs in a byte converter during a cycle.

One can easily visualize the effect of an error by any one of the data bits in the table by changing any single one of the bits and the corresponding check bit of its byte. Then a "1" will result from the summation provided by any of the combinations 2, 1A, 3A, or 4A to indicate an error in every case.

Whenever an error is indicated by trigger 56 the indication will remain until trigger 56 is reset either manually or automatically by means not part of this invention. The reset will generally be provided before each operation of conversion circuit 10.

This invention allows odd parity to be feasible at the converter input or output, or both, whenever the end of a record has insufficient bits to make a full converter cycle.

While the invention has been particularly shown and described with reference to a preferred embodiment thereof, it will be understood by those skilled in the art that various changes in form and details may be made therein without departing from the spirit and scope of the invention.

What is claimed is:

1. A check circuit for a byte converter receiving input bytes having a first number of data bits and providing output bytes having a second number of data bits, said check circuit for a byte converter comprising: a vertical parity check circuit receiving said input bytes and providing an input check bit for each input byte, a vertical parity check-bit generator receiving said output bytes and providing an output check bit for each output byte, a bistable device means for summing each received check bit and each output check bit with the same modulo that represents said check bits, means for inverting at least the first of any input or output odd-parity check bits being provided to the summing means during each cycle of operation of said byte converter, and means for time sampling the output of said summing means between cycles of operation of said byte converter to determine the error status for said byte converter.

2. A check circuit as defined in claim 1, in which any combination of even and odd parity is provided for the input check bits and for the check bit output of said check bit generator.

3. A byte conversion check circuit as defined in claim 1, wherein odd-parity input check bits are provided with said input bytes, and even-parity check bits are provided from said check bit generator, comprising means for inverting said input check bits prior to applying them to summng means device.

4. A check circuit for a byte converter as defined in claim 1, wherein input bytes to said converter have even-parity check bits and said check-bit generator provides odd-parity check bits, and comprising means for inverting check bits from said generator prior to applying them to said summing means.

5. A check circuit for a byte converter as defined in claim 1, comprising time-sampling means for sequencing the check-bits to said summing means.

6. A check circuit for a byte converter as defined in claim 1 including a vertical-parity check circuit receiving said input bytes and check bits, said check circuit having an error indicating output, and means for providing said error indicating output to said summing means, whereby errors in input bytes do not indicate errors in the operation of said converter.

7. A check circuit for a byte converter as defined in claim 6, in which byte-converter timing means is included in said time-sampling means.

8. A check circuit for a byte converter receiving input bytes on a first number of transmission lines, and providing output bytes on a second number of transmission lines, a parallel-redundancy check circuit for receiving input check bits with said input bytes, a parallel-redundancy check-bit generator for receiving said output bytes and providing an output check bit for each output byte, said check circuit for a byte converter comprising a bistable trigger circuit being triggerable to an opposite state whenever a "1" bit is received at its input, first time-sampling gating means receiving said input check bits and providing them to the input of said trigger, second time-sampling gating means receiving said output check bits and providing them to the input of said trigger, and error-sampling means receiving the output of said trigger.

9. A check circuit for a byte converter as defined in claim 8 including first inversion means for inverting said input check bits, second inversion means for inverting the check bits of said generator, and means for switching said first or second inverting means, or both, or none, into the operation of said check circuit according to the type of parallel redundancy check bits provided.

10. A check circuit for a byte converter receiving input bytes with a first plurality of bits, and providing output bytes with a second plurality of bits, said check circuit for a byte converter comprising: a vertical-redundancy check circuit operable with even or odd parity input check bits receiving said input bytes, and a vertical-redundancy check bit generator receiving said output bytes and providing an output check bit of even or odd parity for each output byte, means for selecting even or odd parity operation for said check circuit, means for selecting even or odd parity operation for said generator, first, second, third, snd fourth AND gates, a summation trigger circuit, means connecting an input of said summation trigger circuit to outputs of said first, second, third and fourth AND gates, first inverter means providing said first AND gate with inverted input check bits, said input check bits being applied non-inverted to an input of said second AND gate, second inverter means providing said third AND gate with inverted generator check bits, said generator check bits being applied non-inverted to an input of said fourth AND gate, means for sampling an output of said summation trigger circuit between cycles of operation of said byte converter to determine an error in said byte converter, and means for enabling two of said AND gates in response to said parity selecting means.

11. A check circuit for a byte converter as defined in claim 10 wherein said first and second AND gates each have another input connected to a read-in timing source of said byte converter, and delay means connected between a readout timing input of said byte converter and inputs to said third and fourth AND gates.

12. A check circuit for a byte converter as defined in claim 11, wherein an input-byte error indicating output is provided for said vertical-redundancy check circuit, a fifth AND gate having an input receiving said error indicating output, a second delay means connected between the readout timing input of said byte converter and a second input to said fifth AND gate, and means connecting the output of said fifth AND gate to the input of said summation trigger circuit.

References Cited by the Examiner

UNITED STATES PATENTS

| | | | |
|---|---|---|---|
| 2,904,781 | 9/59 | Katz | 340—146.1 X |
| 2,939,116 | 5/60 | Burns et al. | 340—172.5 |
| 2,951,229 | 8/60 | Goldstein | 340—146.1 |
| 3,017,620 | 1/62 | Abzug | 340—146.1 X |

OTHER REFERENCES

Publication: IBM Technical Disclosure Bulletin, vol. 1, No. 1, June 1958, C. F. Weiss, Jr.

MALCOLM A. MORRISON, *Primary Examiner.*

NEIL C. READ, *Examiner.*

UNITED STATES PATENT OFFICE
CERTIFICATE OF CORRECTION

Patent No. 3,200,242 August 10, 1965

John K. Crawford et al.

It is hereby certified that error appears in the above numbered patent requiring correction and that the said Letters Patent should read as corrected below.

Column 7, line 50, for "summng means device." read -- said summing means. --; column 8, line 29, for "snd" read -- and --.

Signed and sealed this 22nd day of February 1966.

(SEAL)
Attest:

ERNEST W. SWIDER
Attesting Officer

EDWARD J. BRENNER
Commissioner of Patents